(12) United States Patent
McCollum

(10) Patent No.: US 7,248,094 B1
(45) Date of Patent: Jul. 24, 2007

(54) CIRCUIT AND METHOD FOR SUPPLYING PROGRAMMING POTENTIAL AT VOLTAGES LARGER THAN BVDSS OF PROGRAMMING TRANSISTORS

(75) Inventor: John McCollum, Saratoga, CA (US)

(73) Assignee: Actel Corporation, Mountain View, CA (US)

( * ) Notice: Subject to any disclaimer, the term of this patent is extended or adjusted under 35 U.S.C. 154(b) by 111 days.

(21) Appl. No.: 10/997,688

(22) Filed: Nov. 24, 2004

(51) Int. Cl.
*H01H 37/76* (2006.01)

(52) U.S. Cl. .................................. 327/525; 365/225.7

(58) Field of Classification Search ................ 327/525, 327/526; 365/275.7, 225.7
See application file for complete search history.

(56) References Cited

U.S. PATENT DOCUMENTS

| | | | | |
|---|---|---|---|---|
| 4,758,745 A | * | 7/1988 | Elgamal et al. ................ | 326/16 |
| 5,166,557 A | * | 11/1992 | Chen et al. .................... | 326/38 |
| 5,194,759 A | * | 3/1993 | El-Ayat et al. ............... | 327/525 |
| 5,367,207 A | * | 11/1994 | Goetting et al. .............. | 326/38 |
| 5,371,414 A | * | 12/1994 | Galbraith .................... | 327/525 |
| 5,498,978 A | * | 3/1996 | Takahashi et al. ............ | 326/38 |
| 5,537,056 A | * | 7/1996 | McCollum .................... | 326/38 |
| 5,682,106 A | * | 10/1997 | Cox et al. ...................... | 326/39 |
| 5,712,577 A | * | 1/1998 | Cho ............................. | 326/38 |
| 5,844,298 A | * | 12/1998 | Smith et al. ................. | 257/530 |
| 5,929,666 A | * | 7/1999 | Fischer ........................ | 327/111 |
| 6,570,515 B2 | * | 5/2003 | Kang .......................... | 341/120 |
| 6,570,805 B2 | * | 5/2003 | McCollum ............... | 365/225.7 |
| 6,765,427 B1 | | 7/2004 | McCollum .................. | 327/525 |
| 2003/0031043 A1 | * | 2/2003 | Pochmuller ................. | 365/149 |

* cited by examiner

*Primary Examiner*—Kenneth B. Wells
*Assistant Examiner*—Thomas J. Hiltunen

(57) ABSTRACT

A circuit for programming an antifuse coupled between a first node and a second node includes at least one transistor for supplying a programming potential $V_{PP}$ to the first node. A first transistor has a source coupled to a third node switchably coupleable between a potential of $V_{PP}/2$ and ground potential, a drain, and a gate. A second transistor has a source coupled to the drain of the first transistor, a drain coupled to the second node, and a gate. Programming circuitry is coupled to the gate of the first transistor and the gate of the second transistor and configured to in a programming mode apply a potential of either zero volts or VPP/2 to the gate of the first transistor and to apply a potential of VPP/2 to the gate of the second transistor. The first and second transistors have a BVDss rating of not more than about $V_{PP}/2$.

7 Claims, 2 Drawing Sheets

CIRCUIT AND METHOD FOR SUPPLYING PROGRAMMING POTENTIAL AT VOLTAGES LARGER THAN BVDSS OF PROGRAMMING TRANSISTORS

BACKGROUND OF THE INVENTION

1. Field of the Invention

The present invention relates to programmable integrated circuits. More specifically, the present invention relates to a circuit and method for supplying programming potentials to programmable devices at voltages larger than BVDss of programming transistors.

2. Background

User-programmable devices are known in the art. Such devices include, for example, field programmable gate arrays (FPGA's). To implement a particular circuit function in an FPGA, the circuit is mapped into the array and the appropriate programmable elements are programmed to implement the necessary wiring connections that form the user circuit.

Programmable elements such as antifuses are programmed by placing a programming-voltage potential across them that is sufficient to disrupt a normally high-resistance antifuse layer disposed between two antifuse electrodes to create a low-resistance connection between the two electrodes. The programming voltage potential is steered to the antifuse by programming transistors disposed on the integrated circuit.

As integrated circuit devices scale, the voltages that are applied to circuits are lowered, which necessitates the lowering of voltages used to program non-volatile devices on integrated circuits. In the case of antifuses, this means an ever thinning of films such that manufacturability, as well as leakage and breakdown voltage become difficult to control or tolerate.

Referring first to FIG. 1, an example prior-art arrangement for programming antifuses is shown in schematic diagram form. Any of antifuses 10, 12, 14, and 16 may be programmed by turning on the appropriate ones of transistors 18, 20, 22, 24, 26, and 28, to appropriately supply the potentials $V_{PP}$ and ground, as is known in the art. Transistor 30 is turned off to protect the output of inverter 32 when $V_{PP}$ is applied to track 34 or is present on track 34 through an already programmed one of the other antifuses.

SUMMARY OF THE INVENTION

A circuit is provided for programming an antifuse coupled between a first node and a second node. At least one transistor is provided for supplying a programming potential $V_{PP}$ to the first node. A first transistor has a source coupled to a third node switchably coupleable between a potential of $V_{PP}/2$ and ground potential, a drain, and a gate. A second transistor has a source coupled to the drain of the first transistor, a drain coupled to the second node, and a gate. Programming circuitry is coupled to the gate of the first transistor and the gate of the second transistor and configured to in a programming mode apply a potential of either zero volts or VPP/2 to the gate of the first transistor and to apply a potential of VPP/2 to the gate of the second transistor. The first and second transistors have a BVDss rating greater than about $V_{PP}/2$ but less than about $V_{PP}$.

DETAILED DESCRIPTION OF THE INVENTION

Those of ordinary skill in the art will realize that the following description of the present invention is illustrative only and not in any way limiting. Other embodiments of the invention will readily suggest themselves to such skilled persons.

In older semiconductor technologies the BVDss (Drain breakdown voltage with the gate grounded) of transistors used in integrated circuits was only slightly less than the BVJ (junction breakdown voltage). In scaling the technology BVJ has not dropped as fast as the BVDss or BVG (Gate oxide breakdown voltage). With the advent of deep sub-micron technology the BVDss (e.g., 6 volts) is substantially lower than the BVJ (e.g., 12 volts). The drain breakdown voltage is however a constant with respect to the Gate Voltage, so an N-Channel transistor with a BVDss of 6 volts can support 12 volts on its drain if the gate is at 6 volts. By utilizing this feature (along with bootstrap techniques as described in U.S. Pat. No. 6,765,427 to minimize gate oxide stress), it is possible to place two transistors in series with the appropriate biases to switch voltages equal to/or slightly less than BVJ without having to engineer special high voltage transistors. This saves mask count and wafer cost as well as making a design easily portable to different foundries.

Figure 1:
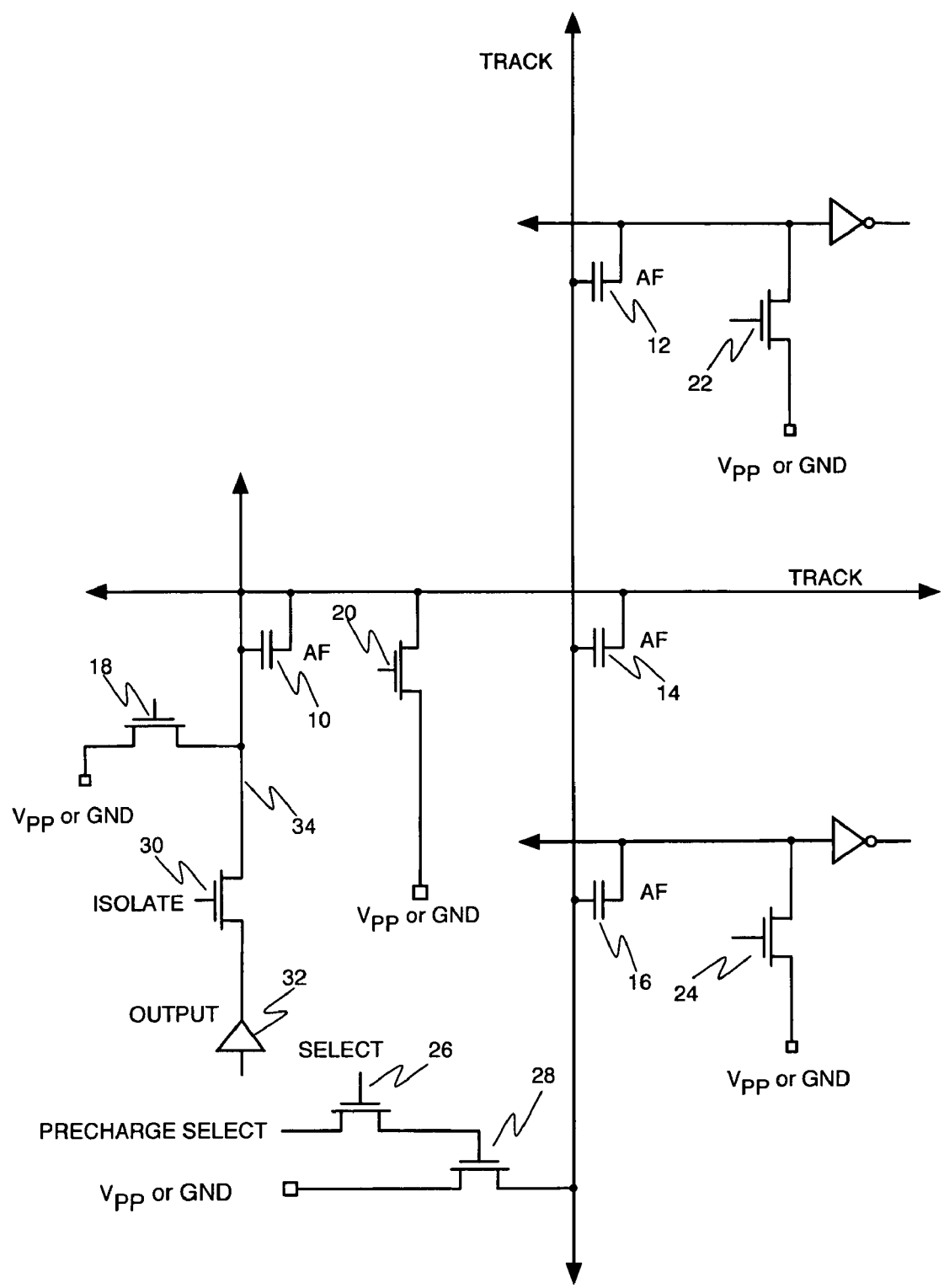
FIG. 1 is a simplified schematic diagram of prior-art programming circuitry illustrating the problem solved by the present invention.
Figure 2:
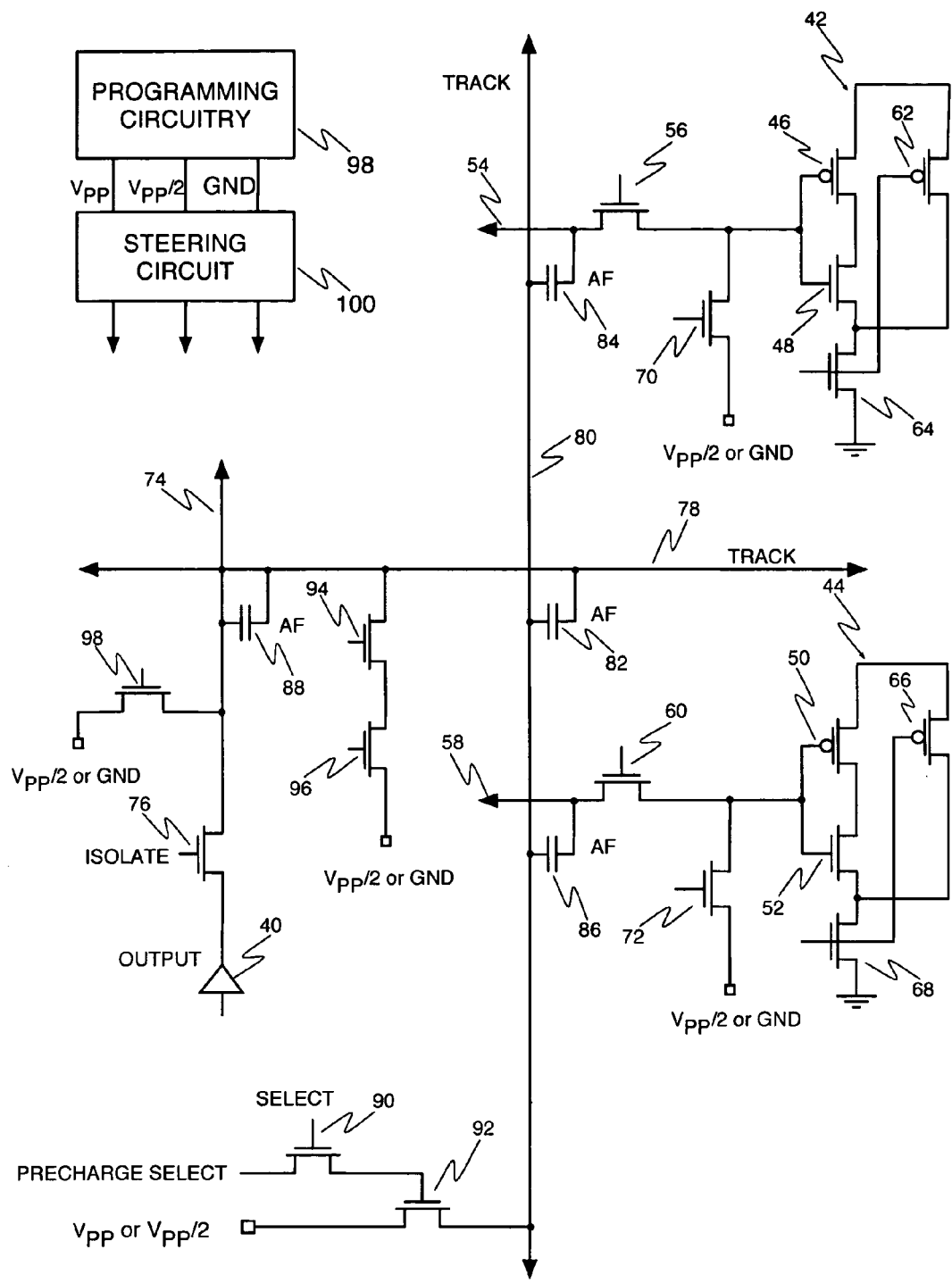
FIG. 2 is a simplified schematic diagram showing illustrative programming circuitry that may be used to carry out the present invention.

Referring now to FIG. 2, a simplified schematic diagram shows illustrative programming circuitry that may be used to carry out the present invention. FIG. 2 shows a portion of a programmable integrated circuit including an output buffer 40, and CMOS inverters 42 and 44. CMOS inverter 42 includes a p-channel MOS transistor 46 and an n-channel MOS transistor 48 and CMOS inverter 44 includes a p-channel MOS transistor 50 and an n-channel MOS transistor 52. The input of CMOS inverter 42 is coupled to an input wiring track 54 via an isolation transistor 56. The input of CMOS inverter 44 is coupled to an input wiring track 58 via an isolation transistor 60. CMOS inverter 42 includes an additional p-channel MOS transistor 62 coupled between $V_{CC}$ and its output and an additional n-channel MOS transistor 64 coupled between the n-channel MOS transistor 48 and ground. Similarly, CMOS inverter 44 includes an additional p-channel MOS transistor 66 coupled between $V_{CC}$ and its output and an additional n-channel MOS transistor 68 coupled between the n-channel MOS transistor 52 and ground. In addition, each of the CMOS inverters 42 and 44 includes an additional n-channel MOS transistor, 70 and 72, respectively, coupled between its input and ground. The output of output buffer 40 is coupled to a vertically-oriented output wiring track 44 via an isolation transistor 76.

Persons of ordinary skill in the art will appreciate that output buffer 40, and inverters 42 and 44 are merely representative of circuit inputs and outputs that might be encountered in a typical user-programmable integrated circuit such as an FPGA and that the present invention is disclosed using these elements for purposes of illustration only.

A portion of an interconnect wiring architecture is also shown in FIG. 2. Horizontal wiring track 78 is shown intersecting vertical wiring track 80. Antifuse 82 is coupled between horizontal wiring track 78 and vertical wiring track 80. In addition, input wiring track 54 is shown intersecting vertical wiring track 80. Antifuse 84 is coupled between input wiring track 54 and vertical wiring track 80. Similarly, input wiring track 58 is also shown intersecting vertical wiring track 80. Antifuse 86 is coupled between input wiring track 58 and vertical wiring track 50. Output wiring track 44 is shown intersecting horizontal wiring track 78. Antifuse 88 is coupled between output wiring track 74 and vertical wiring track 80.

According to an embodiment of the present invention, unidirectional programming may be advantageously employed. Unidirectional programming makes only one of the two programming potential levels, rather than both of them, available to each of the wiring resources. In the illustrative example of FIG. 2, $V_{PP}$ is made available to vertical wiring track 80 and ground is made available to horizontal wiring track 78, input wiring tracks 54 and 58, and output wiring track 74.

As may be seen from an examination of FIG. 2, a bootstrap circuit including n-channel MOS transistors 90 and 92 may be used to supply either the $V_{PP}$ programming potential or the potential $V_{PP}/2$ to vertical wiring track 80. Either $V_{PP}/2$ or ground potential may be supplied to horizontal wiring track 78 through n-channel MOS transistors 94 and 96, connected in series between horizontal wiring track 78 and ground. Either $V_{PP}/2$ or ground potential may be supplied to output wiring track 74 through n-channel MOS transistor 98. Finally, either $V_{PP}/2$ or ground potential may be supplied to input wiring track 54 through n-channel MOS isolation transistor 56 and n-channel MOS transistor 70 and either $V_{PP}/2$ or ground potential may be supplied to input wiring track 58 through n-channel MOS isolation transistor 60 and n-channel MOS transistor 72.

Programming circuitry 98 is configured to supply the potentials $V_{PP}$, $V_{PP}/2$ and ground. Persons of ordinary skill in the art are familiar with such programming circuitry, the details of which are omitted herein order to avoid obscuring the present invention. Steering circuitry 100 is configured to selectively supply the potentials $V_{PP}$, $V_{PP}/2$ and ground to the various circuit nodes in FIG. 2 during a programming cycle depending on which antifuses are to be programmed as is known in the art. Persons of ordinary skill in the art are also familiar with such steering circuitry, the details of which are omitted herein order to avoid obscuring the present invention To illustrate the operation of the present invention, the process for programming antifuse 82, programming antifuse 84 but not antifuse 86, and programming antifuse 88 will be disclosed, again with reference to FIG. 2.

In order to connect vertical wiring track 80 to horizontal wiring track 78, antifuse 82 must be programmed. Isolation transistors 56, 60, and 76 and n-channel MOS transistors 70 and 72 are turned on and the potential $V_{PP}/2$ is applied to the sources of n-channel MOS transistors 70, 72, and 98 in order to protect the inputs of CMOS inverters 42 and 44 and the output of buffer 40.

As may be seen from FIG. 2, the potential $V_{PP}$ will be precharged onto vertical wiring track 80 through the bootstrap circuit made up of transistors 90 and 92 by turning these devices on then off as is known in the art. A potential of about 4 volts is applied to the drain of n-channel MOS transistor 90 and the select input coupled to its gate is turned on and then turned off. This traps the potential at the gate capacitance of n-channel MOS transistor 92. The potential $V_{PP}$ is then applied to the drain of n-channel MOS transistor 92. This action bootstraps the gate voltage of n-channel MOS transistor 94 to $V_{PP}$+4 volts, thus assuring that there will be no $V_T$ drop across n-channel MOS transistor 92 and the entire potential $V_{PP}$ will appear on vertical wiring track 80.

The source of n-channel MOS transistor 96 is coupled to ground. N-channel MOS transistors 94 and 96 are turned on. The gate of n-channel MOS transistor 94 is driven to the potential $V_{PP}/2$ and the gate of n-channel MOS transistor 96 is driven to $V_{PP}/2$. Under these conditions, the voltage at the source of n-channel MOS transistor 94 will be one $V_T$ below $V_{PP}/2$. The entire potential $V_{PP}$ will be applied across antifuse 82. The gate of n-channel MOS transistor 96 is driven to zero volts if antifuse 82 is not to be programmed. Under these conditions, the voltage at the source of n-channel MOS transistor 94 will be one $V_T$ below $V_{PP}/2$.

In order to program antifuse 84 while leaving antifuse 86 unprogrammed, a potential of about 4 volts is applied to the drain of n-channel MOS transistor 90 and the select input coupled to its gate is turned on and then turned off. This traps the potential at the gate capacitance of n-channel MOS transistor 92. The potential $V_{PP}$ is then applied to the drain of n-channel MOS transistor 92. This action bootstraps the gate voltage of n-channel MOS transistor 92 to $V_{PP}$+4 volts, thus assuring that there will be no $V_T$ drop across n-channel MOS transistor 94 and the entire potential $V_{PP}$ will appear on vertical wiring track 80. Both n-channel isolation transistors 56 and 60 will have $V_{PP}/2$ applied to their gates. N-channel MOS transistor 70 will have $V_{PP}/2$ applied to its gate and n-channel MOS transistor 72 will have zero volts applied to its gate. Since n-channel MOS transistors 56 and 70 are in series, as are n-channel MOS transistors 60 and 72, the same voltage conditions that applied to series-connected n-channel MOS transistors 94 and 96 during the programming (or not) of antifuse 82 are present in this programming scenario.

During programming of either antifuse 84 or antifuse 86, zero volts is applied to the gates of both n-channel MOS transistors 64 and 68, and to the gates of p-channel MOS transistors 62 and 66. This turns off n-channel MOS transistors 64 and 68, and turns on p-channel MOS transistors 62 and 66. Under these conditions, the sources of the n-channel MOS transistors 48 and 52 in the inverters 42 and 44 are pulled up to $V_{CC}$ by p-channel MOS transistors 62 and 66, thus protecting the inverter transistors.

In order to program antifuse 88, a potential of about 4 volts is applied to the drain of n-channel MOS transistor 90 and the select input coupled to its gate is turned on and then turned off. This traps the potential at the gate capacitance of n-channel MOS transistor 92. The potential $V_{PP}$ is then applied to the drain of n-channel MOS transistor 92. This action bootstraps the gate voltage of n-channel MOS transistor 92 to $V_{PP}$+4 volts, thus assuring that there will be no $V_T$ drop across n-channel MOS transistor 94 and the entire potential $V_{PP}$ will appear on vertical wiring track 80. This potential will appear on horizontal wiring track 78 through the already-programmed antifuse 82. Isolation transistor 76 is turned off and n-channel MOS transistor 98 is turned on, thus placing the $V_{PP}$ potential across antifuse 88.

The use of this programming circuit and technique allows n-channel MOS transistors 56, 60, 70, 72, 94, and 96 to have BVDss ratings of less than $V_{PP}$. BVDss of an n-channel transistor refers to the breakdown voltage (e.g., the classic breakdown voltage between drain and the well or body of a transistor when the gate and source of the transistor are substantially at ground).

While the present disclosure has been of an illustrative embodiment used to program an antifuse on an integrated circuit, persons of ordinary skill in the art will appreciate that the techniques of the present invention are applicable to providing a high voltage to elements other than antifuses, such as non-volatile memory cells and the like disposed on the integrated circuit and to supplying such voltage potentials to devices located off of the integrated circuit.

While the invention has been described with reference to an exemplary embodiment, it will be understood by those skilled in the art that various changes may be made and equivalents may be substituted for elements thereof without departing from the scope of the invention. Therefore, it is intended that the invention not be limited to the particular embodiment disclosed as the best mode contemplated for carrying out this invention, but that the invention will include all embodiments falling within the scope of the appended claims.

What is claimed is:

1. A circuit for applying current to an antifuse coupled between a first node and a second node with a potential $V_{PP}$, the circuit disposed on an integrated circuit and comprising:
   a first n-channel MOS transistor having a source coupled to a third node switchably coupleable between a potential of about $V_{PP}/2$ and ground potential, a drain, and a gate;
   a second n-channel MOS transistor having a source coupled to said drain of said first n-channel MOS transistor, a drain coupled to the second node, and a gate;
   a bootstrap circuit formed form a third n-channel MOS transistor having a source coupled to said first node, a drain coupled to a node selectively carrying the potential $V_{PP}$ or the potential $V_{PP}/2$, and a gate, and a fourth n-channel MOS transistor having a source coupled to said gate of said third n-channel MOS transistor, a drain coupled to a precharge select node, and a gate coupled to a programming control node; and
   circuitry coupled to said gate of said first n-channel MOS transistor and said gate of said second n-channel MOS transistor and configured to, in a current-applying mode, apply a potential of either zero volts or about $V_{PP}/2$ to said gate of said first n-channel MOS transistor and to apply a potential of about $V_{PP}/2$ to said gate of said second n-channel MOS transistor.

2. The circuit of claim 1 wherein the first node and second node are located off of the integrated circuit and the device is an external device.

3. The circuit of claim 1 wherein said first and second n-channel MOS transistors have a BVDss rating of not more than about $V_{PP}/2$.

4. The circuit of claim 1 wherein:
   said first node is a wiring track;
   said second node is a circuit input track; and
   said drain of said first n-channel MOS transistor and said source of said second n-channel MOS transistor are coupled to a circuit input associated with said circuit input track.

5. The circuit of claim 1 wherein said first node is a first wiring track and said second node is a second wiring track.

6. The circuit of claim 1 further including:
   a circuit output track coupled to a circuit output through an isolation transistor and to said second wiring track through a second antifuse; and
   a third n-channel MOS transistor having a source coupled to a fourth node switchably coupleable between a potential of $V_{PP}/2$, a drain coupled to said circuit output track, and a gate coupled to said programming circuitry, said programming circuitry further configured to in a programming mode selectively turn on said third n-channel MOS transistor.

7. A method for programming an antifuse that programs at a potential $V_{PP}$ using transistors having BVDss values of about $V_{PP}/2$, comprising:
   selectively providing a circuit path from a first node supplying the potential $V_{PP}$ to a first electrode of the antifuse;
   providing a first n-channel MOS transistor having a source coupled to a second node, a drain, and a gate, and a second n-channel MOS transistor having a source coupled to said drain of said first n-channel MOS transistor, a drain coupled to a second electrode of the antifuse, and a gate; and
   applying a potential of about $V_{PP}/2$ to said gates of said first and second n-channel MOS transistors if said antifuse is to be programmed and applying a potential of zero volts to said gate of said first n-channel MOS transistor and a potential of about $V_{PP}/2$ to said gate of said second n-channel MOS transistor if said antifuse is not to be programmed.

* * * * *